(12) United States Patent
Wang et al.

(10) Patent No.: US 9,659,975 B2
(45) Date of Patent: May 23, 2017

(54) FABRICATION METHODS OF TRANSPARENT CONDUCTIVE ELECTRODE AND ARRAY SUBSTRATE

(71) Applicant: BOE TECHNOLOGY GROUP CO., LTD., Beijing (CN)

(72) Inventors: Meili Wang, Beijing (CN); Fengjuan Liu, Beijing (CN); Chunsheng Jiang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 62 days.

(21) Appl. No.: 14/436,576

(22) PCT Filed: Sep. 15, 2014

(86) PCT No.: PCT/CN2014/086478
§ 371 (c)(1),
(2) Date: Apr. 17, 2015

(87) PCT Pub. No.: WO2015/127776
PCT Pub. Date: Sep. 3, 2015

(65) Prior Publication Data
US 2016/0086981 A1    Mar. 24, 2016

(30) Foreign Application Priority Data

Feb. 25, 2014  (CN) .......................... 2014 1 0064958

(51) Int. Cl.
*H01L 21/44*  (2006.01)
*H01L 27/12*  (2006.01)
*G02F 1/1343*  (2006.01)

(52) U.S. Cl.
CPC ...... *H01L 27/1244* (2013.01); *G02F 1/13439* (2013.01); *H01L 27/1259* (2013.01); *G02F 2001/134372* (2013.01)

(58) Field of Classification Search
CPC .................................................... H01L 27/1259
(Continued)

(56) References Cited

U.S. PATENT DOCUMENTS 7,323,713 B2   1/2008  Ishiga et al.
2002/0076660 A1  6/2002  Toyota et al.
(Continued)

FOREIGN PATENT DOCUMENTS

CN        1254945 A    5/2000
CN        1727977 A    2/2006
(Continued)

OTHER PUBLICATIONS

International Search Report of PCT/CN2014/086478 in Chinese with English translation, mailed Dec. 31, 2014.
(Continued)

*Primary Examiner* — Hsin-Yi Hsieh
(74) *Attorney, Agent, or Firm* — Collard & Roe, P.C.

(57) ABSTRACT

Fabrication methods of a transparent conductive electrode (301) and an array substrate are provided. The fabrication method of the transparent conductive electrode (301) comprises: forming a sacrificial layer pattern (201) on a substrate (10) having a first region (A1) and a second region (A2) adjacent to each other, wherein the sacrificial layer pattern (201) is located in the second region (A2), and has an upper sharp corner profile formed on a side adjacent to the first region (A1); forming a transparent conductive thin-film (30) in the first region (A1) and the second region (A2) of the substrate (10) with the sacrificial layer pattern (201) formed thereon, wherein a thickness ratio of the transparent conductive thin-film (30) to the sacrificial layer pattern (201) is less than or equal to 1:1.5, and the transparent conductive thin-film (30) is disconnected at the upper sharp corner profile of the sacrificial layer pattern (201), such that at least (Continued)

a part of a side surface of the sacrificial layer pattern (201) facing the first region (A1) is exposed; and removing the sacrificial layer pattern (201) so as to reserve the transparent conductive thin-film (30) in the first region as the transparent conductive electrode (301).

20 Claims, 5 Drawing Sheets

(58) Field of Classification Search
   USPC .................................................. 438/609
   See application file for complete search history.

(56) References Cited

U.S. PATENT DOCUMENTS

| 2008/0050853 | A1 | 2/2008 | Seo et al. |
| 2009/0321115 | A1 | 12/2009 | Yang |

FOREIGN PATENT DOCUMENTS

| CN | 101131965 A | 2/2008 |
| CN | 101278239 A | 10/2008 |
| CN | 103839794 A | 6/2014 |
| KR | 2002-0005152 A | 1/2002 |

OTHER PUBLICATIONS

Notice of Transmittal of the International Search Report of PCT/CN2014/086478 in Chinese, mailed Dec. 31, 2014.
Written Opinion of the International Search Report of PCT/CN2014/086478 in Chinese with English translation, mailed Dec. 31, 2014.
Chinese Office Action in Chinese Application No. 201410064958.7 mailed Jan. 20, 2016 with English translation.

FABRICATION METHODS OF TRANSPARENT CONDUCTIVE ELECTRODE AND ARRAY SUBSTRATE

CROSS REFERENCE TO RELATED APPLICATIONS

This application is the National Stage of PCT/CN2014/086478 filed on Sep. 15, 2014, which claims priority under 35 U.S.C. §119 of Chinese Application No. 201410064958.7 filed on Feb. 25, 2014, the disclosure of which is incorporated by reference.

TECHNICAL FIELD

Embodiments of the present disclosure relate to fabrication methods of a transparent conductive electrode and an array substrate.

BACKGROUND

Indium Tin Oxides (ITO) is good in electroconductivity and transparency, and thus is the most commonly used thin-film material of a transparent conductive electrode in an array substrate. At present, a patterning process is most commonly adopted for fabricating a transparent conductive electrode, namely, firstly forming a transparent conductive thin-film with a certain thickness on a substrate, forming a photoresist on the transparent conductive thin-film, and then obtaining the transparent conductive electrode with a specific pattern by using a mask plate through exposing, developing, etching, stripping and other processes.

However, at the etching phase of the above process, etching residue for ITO grain often appears, which may cause leakage current and short circuit, thus affecting the quality of product.

SUMMARY OF THE INVENTION

An embodiment of the present disclosure provides a fabrication method of a transparent conductive electrode, comprising: forming a sacrificial layer pattern on a substrate having a first region and a second region adjacent to each other, wherein the sacrificial layer pattern is located in the second region, and has an upper sharp corner profile formed on a side adjacent to the first region; forming a transparent conductive thin-film in the first and second regions of the substrate with the sacrificial layer pattern formed thereon, wherein a thickness ratio of the transparent conductive thin-film to the sacrificial layer pattern is less than or equal to 1:1.5, and the transparent conductive thin-film is disconnected at the upper sharp corner profile of the sacrificial layer pattern, such that at least a part of a side surface of the sacrificial layer pattern facing the first region is exposed; and removing the sacrificial layer pattern so as to reserve the transparent conductive thin-film in the first region as the transparent conductive electrode.

Another embodiment of the present disclosure provides a fabrication method of an array substrate, comprising: forming a thin film transistor on a base substrate, and forming a pixel electrode electrically connected to a drain of the thin film transistor, wherein the pixel electrode is fabricated by the above fabrication method.

Still another embodiment of the present disclosure provides a fabrication method of an array substrate, comprising: forming a thin film transistor on a base substrate, forming a pixel electrode electrically connected to a drain of the thin film transistor, and forming a common electrode, wherein the pixel electrode and the common electrode are both fabricated by the above fabrication method.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DESCRIPTION OF THE EMBODIMENTS

The technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

The embodiments of the present disclosure provide fabrication methods of a transparent conductive electrode and an array substrate, which can achieve the purpose of no residue after etching, during fabricating the transparent conductive electrode.

Figure 1:
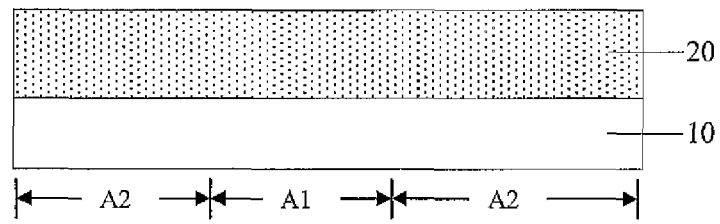
FIG. 1 to FIG. 4 are structural schematic diagrams corresponding to steps of a fabricating method of a transparent conductive electrode, provided by an embodiment of the present disclosure.
Figure 2:
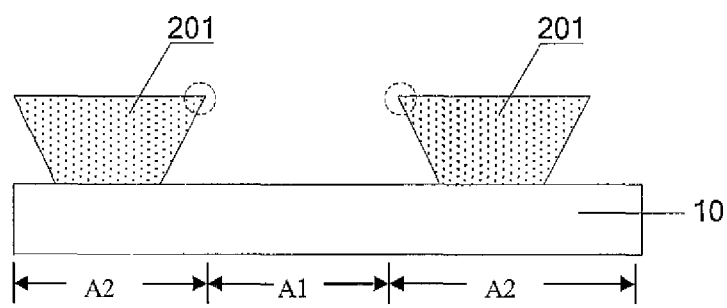

The fabrication method of the transparent conductive electrode provided by an embodiment of the present disclosure comprises steps of:

S01: firstly, as shown in FIG. 1, forming a sacrificial layer 20 on a substrate 10 comprising a first region A1 and a second region A2 adjacent to each other; then as shown in FIG. 2, performing a patterning process to the sacrificial layer 20 so as to form a sacrificial layer pattern 201 in the second region A2 of the substrate 10, wherein the sacrificial layer pattern 201 has an upper sharp corner profile formed on a side adjacent to the first region A1, as shown by a dashed circle region in FIG. 2; the upper sharp corner profile of the sacrificial layer pattern 201 is configured to break a transparent conductive film to be subsequently formed.

In an example, an angle of an upper sharp corner of the sacrificial layer pattern 201 is within a range of 20-80 degrees.

In an example, an area of an upper surface of the sacrificial layer pattern 201 away from the substrate is, for example, greater than an area of a lower surface thereof close to the substrate.

In an example, the sacrificial layer pattern 201 is formed to have a cross section of inverted trapezoid shape, as shown in FIG. 2.

S02: forming a transparent conductive thin-film 30 on the substrate 10 with the sacrificial layer pattern 201 formed thereon. Herein, since the sacrificial layer pattern 201 is formed to have the upper sharp corner profile, part of the transparent conductive thin-film 30 is located on the sacrificial layer pattern 201 while another part of the transparent conductive thin-film 30 is located in the first region A1 of the substrate 10 to serve as a transparent conductive electrode 301. The part of the transparent conductive thin-film located on the sacrificial layer pattern 201 is disconnected with the transparent conductive electrode 301 located in the first region A1 of the substrate 10. A side of the sacrificial layer pattern 201, facing the transparent conductive electrode 301 is exposed.

In an example, a thickness ratio of the transparent conductive thin-film 30 to the sacrificial layer pattern 201 is less than or equal to 1:1.5.

S03: removing the sacrificial layer pattern 201 and the transparent conductive thin-film thereon by wet etching so as to reserve the transparent conductive thin-film 301 in the first region A1 on the substrate 10.

Figure 3:
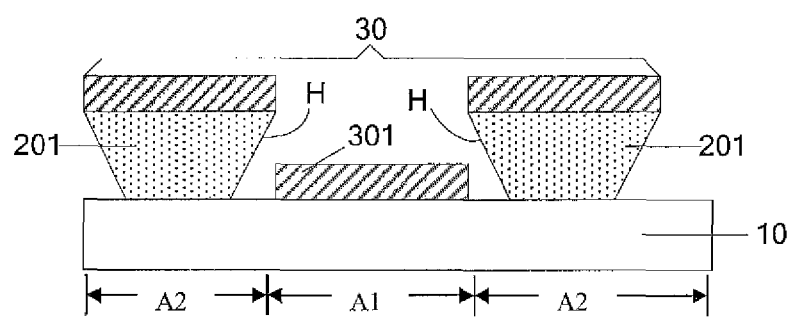

In step S03, for example, the substrate shown in FIG. 3 is put into a wet etchant having a etching selection ratio of the transparent conductive thin-film to the sacrificial layer pattern which is less than or equal to 1:20. Since a side surface of the sacrificial layer pattern 201 facing the transparent conductive thin-film 30 is exposed by the disconnected transparent conductive thin-film 30, the etching agent can rapidly etch the sacrificial layer pattern away from the side surface and take away the transparent conductive thin-film located on the sacrificial layer pattern, thereby leaving the transparent conductive thin-film in the first region A1 as the transparent conductive electrode 301.

It should be noted that, in the embodiment of the present disclosure, the number of the first regions is non-limitative, and the region where the transparent conductive electrode is expected to be formed is a first region.

For example, as for the transparent pixel electrodes on the array substrate, since each pixel unit on the whole substrate is formed to have a pixel electrode, the region where the pixel electrode is located is a first region.

In addition, in the embodiment of the present disclosure, the thicknesses of the transparent conductive thin-film and that of the sacrificial layer pattern and the angle of the upper sharp corner of the sacrificial layer pattern are configured to ensure that after the transparent conductive thin-film is formed, a side surface H of the sacrificial layer pattern, facing the adjacent first region, is exposed.

In the embodiment of the present disclosure, in the case that the material of the transparent conductive thin-film is determined, the material of the sacrificial layer is non-limitative, as long as the adopted etching agent has an etching selection ratio of the transparent conductive thin-film to the sacrificial layer pattern which is less than or equal to 1:20.

In addition, the thicknesses of the transparent conductive thin-film and that of the sacrificial layer can be reasonably set according to practice, so as to ensure that the transparent conductive electrode with the specific pattern and thickness is formed in the first region A1 after the sacrificial layer pattern is etched away.

In the embodiment of the present disclosure, the substrate can be a base substrate without any pattern layer thereon, or can be a substrate having a pattern layer formed on a base substrate.

In the embodiment of the present disclosure, due to the upper sharp corner profile of the sacrificial layer pattern and the thickness relationship between the transparent conductive thin-film and the sacrificial layer pattern, the part of the transparent conductive thin-film located on the sacrificial layer pattern is disconnected with the another part of the transparent conductive thin-film located in the first region when the transparent conductive thin-film is formed, such that the side surface of the sacrificial layer pattern can be exposed at the disconnection of the transparent conductive thin-film. Furthermore, as the sacrificial layer pattern has a relatively high etching speed, the sacrificial layer pattern can be rapidly etched away and the part of the transparent conductive thin-film located thereon is taken away, and thereby the another part of the transparent conductive thin-film located in the first region is reserved to form the transparent conductive electrode, so as to achieve no residue after etching.

Based on the above description, in consideration of the etching speed for etching the sacrificial layer pattern, and the influence of etching time for the transparent conductive electrode located in the first region, in an example, the thickness ratio of the transparent conductive thin-film to the sacrificial layer pattern is between 1:1.5 and 1:3.

For example, the adopted wet etchant has an etching selection ratio of the transparent conductive thin-film to the sacrificial layer pattern which is between 1:20 and 1:200.

Additionally, Indium Tin Oxide (ITO), due to characteristics such as electrical conductivity and optical transparency, is widely applied to various types of display devices to serve as electrodes; therefore, the material of the transparent conductive thin-film in the embodiment of the present disclosure can be ITO. Of course, the material of the transparent conductive thin-film also can be Indium Zinc Oxides (IZO).

In addition, the material of the sacrificial layer pattern, namely the material of the sacrificial layer, can be metal nitrogen oxides, such as ZnON.

Herein, ions of metals such as Al, Ga, In and the like, can be doped into the ZnON.

Further, in the case that the material of the sacrificial layer is ZnON, a hydrochloric acid solution with a concentration of 0.1%-0.3% can be adopted to etch the sacrificial layer pattern, so as to furthest avoid influence on the transparent conductive thin-film when etching the sacrificial layer pattern during the fabrication of the transparent conductive electrode.

Etchant for etching the ITO and IZO is generally high-concentration strong acid such as aqua regia or concentrated acid, while hydrochloric acid with a relatively small concentration is used for etching herein, so as to ensure that the transparent conductive thin-film is influenced as little as possible. That is, when the substrate on which the sacrificial layer pattern and the transparent conductive thin-film are formed is soaked in the hydrochloric acid solution with a concentration of 0.1%~0.3%, the etching selection ratio of the transparent conductive thin-film to the sacrificial layer pattern is 1:50, and therefore, the etchant exerts a very small influence on the transparent conductive thin-film.

In addition, considering that temperature can influence the etching selection ratio, which causes etching to the transparent conductive thin-film, the temperature range of the hydrochloric acid solution is controlled between 20° C. and 45° C. herein.

A fabrication method of the transparent conductive electrode provided by an embodiment of the present disclosure is described in detail by a particular example below. The method comprising:

S101: as shown in FIG. 1, depositing a sacrificial layer 20 that is 200 nm thick and made of ZnON material on a protective layer 10 of a substrate, and performing a patterning process to the sacrificial layer 20 so as to form a sacrificial layer pattern 201 with an upper sharp corner profile as shown in FIG. 2 in a second region A2 besides a first region A1.

An area of an upper surface of the sacrificial layer pattern 201 far away from the substrate is, for example, greater than that of a lower surface of the sacrificial layer pattern 201 close to the substrate. The side surface H of the sacrificial layer pattern 201 is an inclined surface with a relatively small inclination angle, namely, the sacrificial layer pattern 201 has a relatively small upper sharp corner, such as 70 degrees.

S102: as shown in FIG. 3, depositing a transparent conductive thin-film 30 that is 70 nm thick and made of ITO material on the substrate with the sacrificial layer pattern 201 formed thereon.

Since the thickness of the sacrificial layer pattern 201 is about 2.8 times that of the transparent conductive thin-film 30 and the sacrificial layer pattern 201 presents a very gentle inverted etching angle, the transparent conductive thin-film 30, when deposited, is disconnected at the upper sharp corner of the sacrificial layer pattern 201, that is, the transparent conductive thin-film 30 includes a first part located on the sacrificial layer pattern 201 and a second part located in the first region A1 which are disconnected at the interface thereof.

Figure 4:
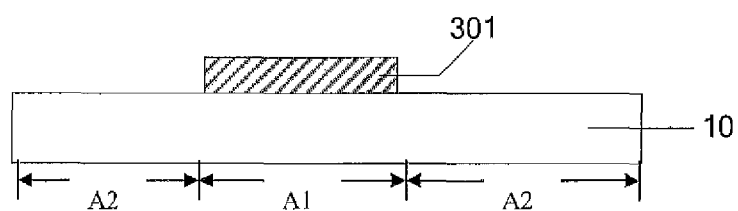

S103: soaking the substrate with the sacrificial layer pattern 201 and the transparent conductive thin-film 30 formed thereon into a hydrochloric acid solution with a concentration of 0.1%~0.3% and a temperature of 20° C.~45° C., so as to etch off the sacrificial layer pattern 201 and take away the first part of the transparent conductive thin-film 30 located on the sacrificial layer pattern 201, thereby reserving the second part located in the first region, so as to form the transparent conductive electrode 301 as shown in FIG. 4.

In the hydrochloric acid solution, an etching speed for the ZnON sacrificial layer pattern 201 is, for example, 5 nm/s-8 nm/s along a vertical direction vertical to a surface of the substrate, and an etching speed for the ZnON sacrificial layer pattern 201 is, for example, 140 nm/s-200 nm/s along a horizontal direction perpendicular to the vertical direction; therefore, a soaking time in the hydrochloric acid solution is, for example, 25 s~40 s.

In the embodiment of the present disclosure, since the sacrificial layer pattern 201 has a relatively high etching speed, the sacrificial layer pattern 201 can be rapidly etched off and the first part of the transparent conductive thin-film 30 located thereon is removed, and thereby the second part of the transparent conductive thin-film 30 located in the first region is reserved to form the transparent conductive electrode 301, so as to achieve no residue after etching.

An embodiment of the present disclosure further provides a fabrication method of an array substrate, comprising: forming a thin film transistor on a base substrate, and forming a pixel electrode electrically connected to a drain of the thin film transistor, wherein the pixel electrode is prepared by the above fabrication method of the transparent conductive electrode.

Herein, the thin film transistor includes a gate, a gate insulating layer, an active layer, a source and a drain.

Figure 5:
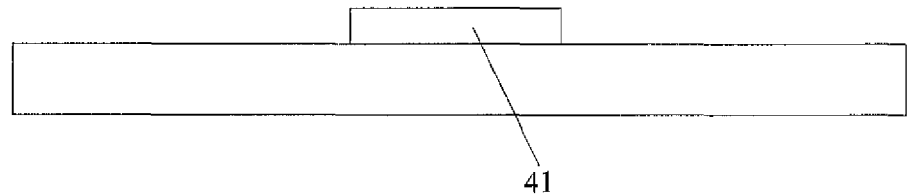
FIG. 5 to FIG. 12 are structural schematic diagrams corresponding to steps of a fabricating method of an array substrate, provided by an embodiment of the present disclosure.

In an example, taking an array substrate of bottom gate type for example, the fabrication method of the array substrate, for example, comprises steps of:

S201: preparing a metal thin-film which is 1000 Å to 7000 Å thick on a base substrate through a magnetron sputtering process, and forming a gate metal layer as shown in FIG. 5 by a patterning process, wherein the gate metal layer includes a gate electrode 41, a gate line (not shown in FIG. 5) and a gate line lead (not shown in FIG. 5).

Figure 6:
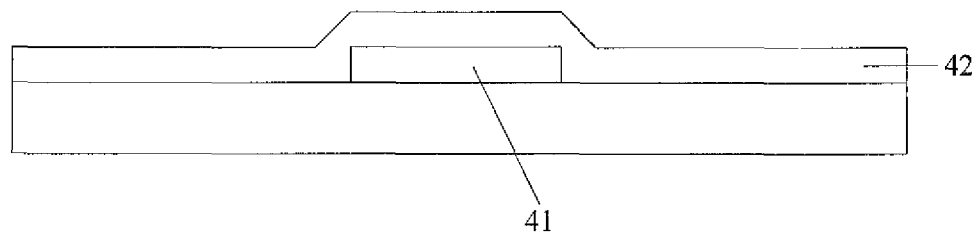

S202: on the substrate thus formed after completing the step S201, forming an insulating thin-film which is 1000 Å to 6000 Å thick through a chemical vapor deposition process, so as to form a gate insulating layer 42 as shown in FIG. 6.

Figure 7:
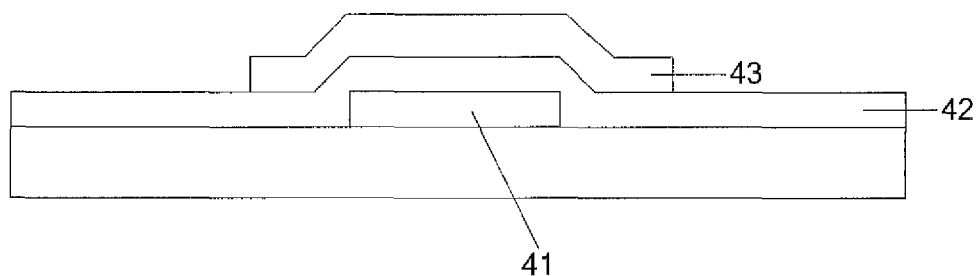

S203: on the substrate thus formed after completing the step S202, forming an active film which is 1000 Å to 6000 Å thick through a chemical vapor deposition process, and forming an active layer 43 as shown in FIG. 7 by a patterning process.

Figure 8:
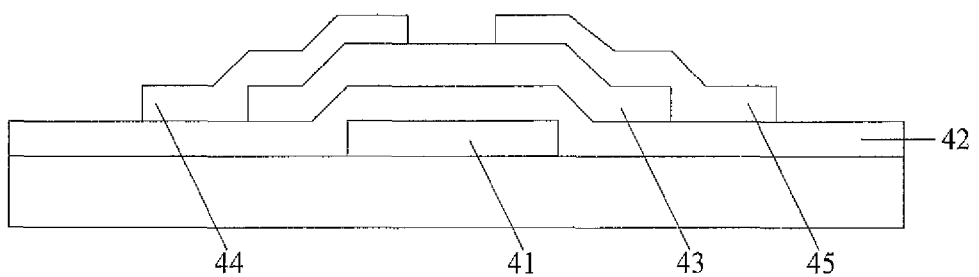

S204: on the substrate thus formed after completing the step S203, forming a metal thin-film which is 1000 Å to 7000 Å thick through a magnetron sputtering process, and forming a source-drain metal layer as shown in FIG. 8 by a patterning process, wherein the source-drain metal layer includes a source 44, a drain 45 and a data line lead (not shown in FIG. 8).

Figure 9:
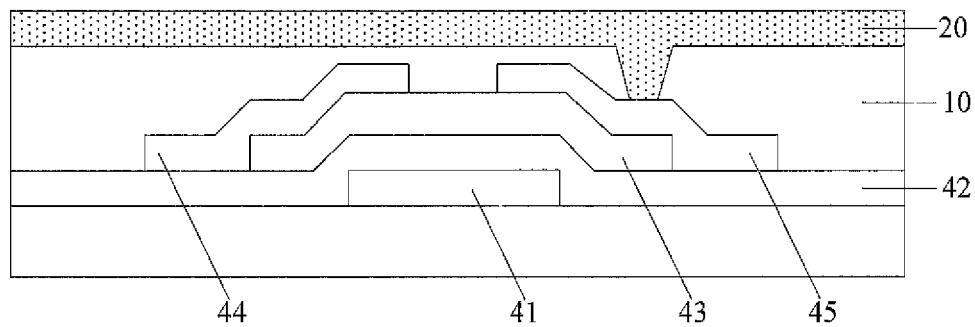

S205: on the substrate thus formed after completing the step S204, forming a protective layer thin-film which is 1000 Å to 6000 Å thick through a chemical vapor deposition process, and forming a protective layer 10 comprising a via hole as shown in FIG. 9 by a patterning process.

Herein, the via hole exposes the drain 45.

Figure 10:
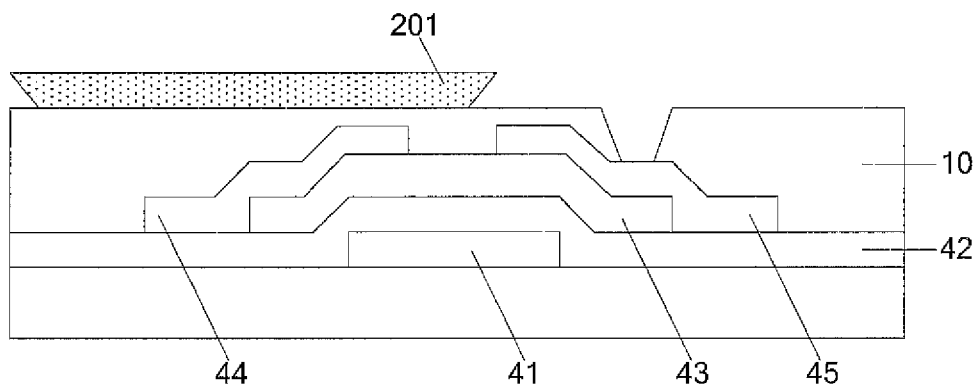

S206: as shown in FIG. 9, on the substrate thus formed after completing the step S205, forming a sacrificial layer 20 which is made of ZnON material and 150 Å to 3000 Å thick through a chemical vapor deposition process, and forming a sacrificial layer pattern 201 as shown in FIG. 10 on the substrate besides the first region by performing a patterning process to the sacrificial layer 20. The sacrificial layer pattern 201 has an upper sharp corner profile; an area of an upper surface of the sacrificial layer pattern 201 far away from the substrate is greater than that of a lower surface of the sacrificial layer pattern 201 close to the substrate; and a side surface of the sacrificial layer pattern 201 is an inclined surface with a relatively small inclination angle.

Herein, in the case that the sacrificial layer 20 is formed by using a chemical vapor deposition process, a process temperature is controlled to be lower than 200° C.

Herein, the first region is a region in which the pixel electrode is to be formed.

Figure 11:
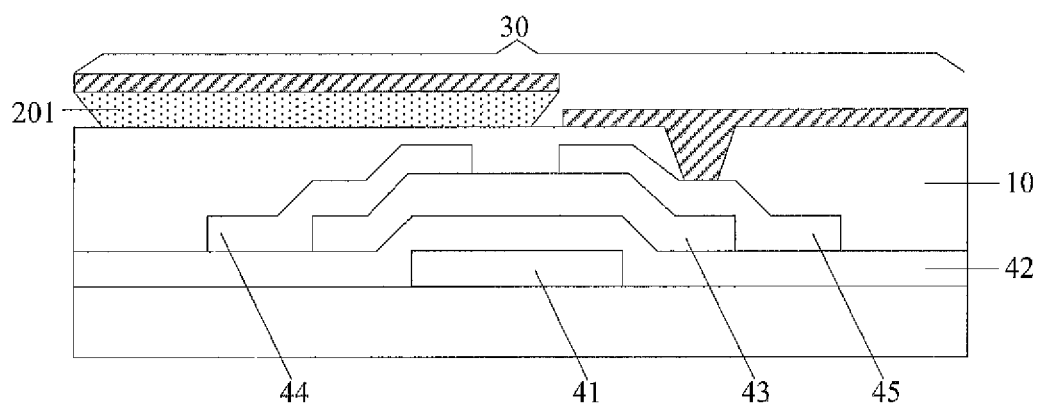

S207: as shown in FIG. 11, on the substrate thus formed after completing the step S206, forming a transparent conductive thin-film 30 which is made of ITO material and is 100 Å to 1000 Å thick through a chemical vapor deposition process.

Herein, a thickness ratio of the transparent conductive thin-film 30 to the sacrificial layer pattern 201 (i.e., the sacrificial layer 20) is 1:1.5-1:3. On such basis, the sacrificial layer pattern 201 presenting a gentle inclination angle breaks the transparent conductive thin-film 30 at the upper sharp corner of the sacrificial layer pattern 201 when the transparent conductive thin-film 30 is deposited; that is, the transparent conductive thin-film 30 includes a first part located on the sacrificial layer pattern 201 and a second part located in a first region which are disconnected at the interface thereof.

Figure 12:
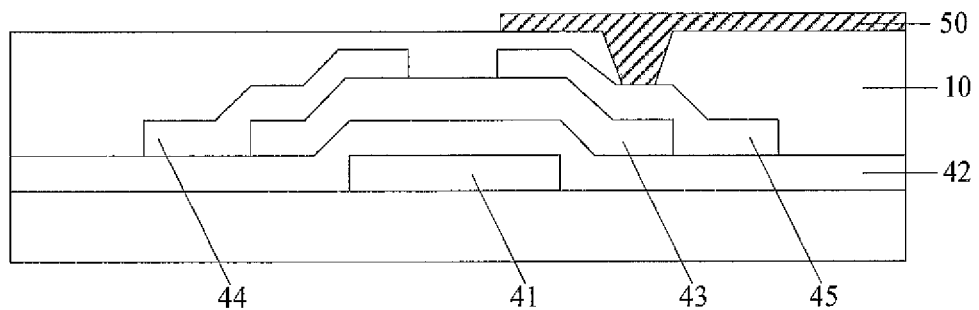

S208: soaking the substrate thus formed after completing the step S207 into a hydrochloric acid solution with a concentration of 0.1%-0.3% and a temperature of 20° C.~45° C., to etch off the sacrificial layer pattern 201 and remove the first part of the transparent conductive thin-film 30 located on the sacrificial layer pattern 201, so that the second part located in the first region is reversed to form a pixel electrode 50 as shown in FIG. 12.

Herein, in the hydrochloric acid solution, an etching speed for the ZnON sacrificial layer pattern 201 is, for example, 5 nm/s-8 nm/s along a vertical direction vertical to a surface of the substrate, and an etching speed for the ZnON sacrificial layer pattern 201 is, for example, 140 nm/s-200 nm/s along a horizontal direction perpendicular to the vertical direction; on such basis, a soaking time in the hydrochloric acid solution can be reasonably selected to avoid etching the transparent conductive thin-film, so as not to influence the pixel electrode.

An embodiment of the present disclosure further provides a fabrication method of an array substrate, comprising: forming a thin film transistor on a base substrate, forming a pixel electrode electrically connected to a drain electrode of the thin film transistor, and forming a common electrode, wherein the pixel electrode and the common electrode are both fromed by the fabrication method of the transparent conductive electrode.

Figure 13:
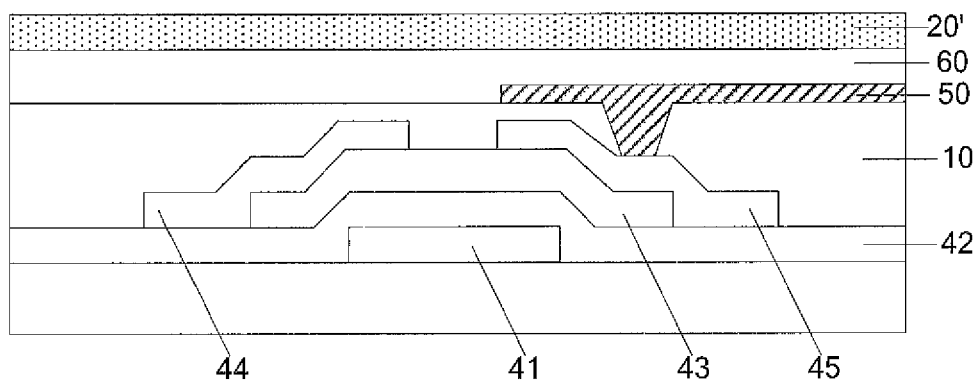
FIG. 13 to FIG. 16 are structural schematic diagrams corresponding to steps of further fabricating an array substrate comprising a common electrode on the basis of FIG. 5 to FIG. 12.

In an example, taking the array substrate of bottom gate type for example, based on steps S201-S208, the fabrication method of the array substrate including the common electrode can further comprise steps of:

S209: as shown in FIG. 13, on the substrate thus formed after completing the step S208, forming a passivation layer 60 which is 1000 Å to 6000 Å thick through a chemical vapor deposition process.

Figure 14:
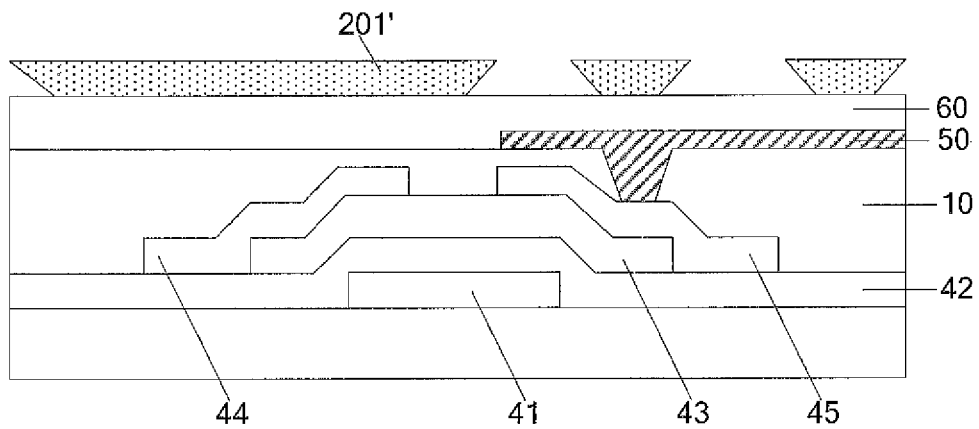

S210: as shown in FIG. 13, on the substrate thus formed after completing the step S209, forming a sacrificial layer 20' which is made of ZnON material and 150 Å to 3000 Å thick through a chemical vapor deposition process, and forming a sacrificial layer pattern 201' as shown in FIG. 14 in the second region besides the first region on the substrate by performing a patterning process to the sacrificial layer 20'. The sacrificial layer pattern 201' has an upper sharp corner profile; an area of an upper surface of the sacrificial layer pattern 201' far away from the substrate is greater than that of a lower surface of the sacrificial layer pattern 201' close to the substrate; and a side surface of the sacrificial layer pattern 201' is an inclined surface with a relatively small inclination angle.

When the sacrificial layer 20' is formed by using a chemical vapor deposition process, a process temperature is controlled to be lower than 200° C.

Herein, the first region is a region in which the common electrode is to be formed.

Figure 15:
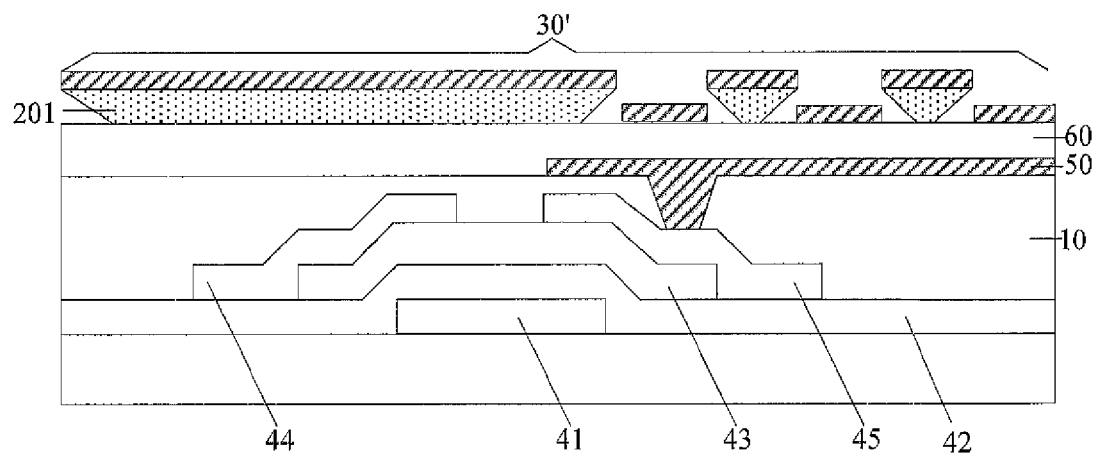

S211: as shown in FIG. 15, on the substrate thus formed after completing the step S210, forming a transparent conductive thin-film 30' which is made of ITO material and is 100 Å to 1000 Å thick by a chemical vapor deposition process.

Herein, a thickness ratio of the transparent conductive thin-film 30' to the sacrificial layer pattern 201' (i.e., the sacrificial layer 20') is 1:1.5-1:3. On such basis, the sacrificial layer pattern 201' provided with an upper sharp corner profile breaks the transparent conductive thin-film 30' at the upper sharp corner of the sacrificial layer pattern 201' when the transparent conductive thin-film 30' is deposited; that is, the transparent conductive thin-film 30' includes a first part located on the sacrificial layer pattern 201' and a second part located in a first region which are disconnected at the interface thereof.

Figure 16:
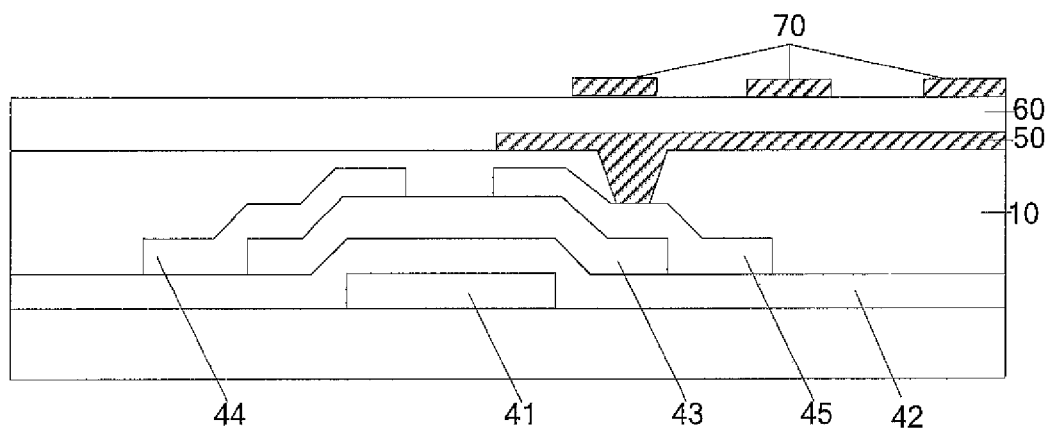

S212: soaking the substrate thus formed after completing the step S210 into a hydrochloric acid solution with a concentration of 0.1%-0.3% and a temperature of 20° C.~45° C., to etch off the sacrificial layer pattern 201' and remove the first part of the transparent conductive thin-film 30' located on the sacrificial layer pattern 201', so that the second part of the transparent conductive thin-film 30' located in the first region is reserved to form a common electrode 70 as shown in FIG. 16.

Herein, in the hydrochloric acid solution, an etching speed for the ZnON sacrificial layer pattern 201' is, for example, 5 nm/s-8 nm/s along a vertical direction vertical to a surface of the substrate, and an etching speed for the ZnON sacrificial layer pattern 201' is, for example, 140 nm/s-200 nm/s along a horizontal direction perpendicular to the vertical direction; on such basis, a soaking time in the hydrochloric acid solution can be reasonably selected to avoid etching the transparent conductive thin-film, so as not to influence the common electrode.

The array substrate, for example, can further include a color film (not indicated in the diagrams) which includes a red photoresist, a green photoresist and a blue photoresist.

In this case, the method can further include a step of forming the red photoresist, the green photoresist and the blue photoresist, which will not be described in detail herein.

It should be noted that, embodiments of the present disclosure are not limited to fabricating an array substrate of a liquid crystal display panel, and can also be applicable to fabricating an array substrate of an organic electroluminescence diode display panel; In this case, a thin film transistor and an anode located in a first region can be formed according to steps S201-S207, and then an organic material functional layer and a cathode are formed on the substrate with the anode formed thereon, wherein when the cathode is also made of a transparent material, such as ITO, the cathode can also be formed according to the method for fabricating the transparent conductive electrode, and the detailed description thereof is not repeated herein.

Herein, the organic material functional layer can include an electron transport layer, a light emitting layer and a hole transport layer, and further can include an electron injecting layer located between the cathode and the electron transport layer, and a hole injecting layer located between the anode and the hole transport layer.

Of course, the cathode can be formed at first, and then the organic material functional layer and the anode can be formed; as long as the electrodes are made of a transparent material, they can both be prepared according to the method for fabricating the transparent conductive electrode.

According to the above description, at least the following structures and methods can be provided according to the embodiments of the present disclosure:

(1) A fabrication method of a transparent conductive electrode, comprising:

forming a sacrificial layer pattern on a substrate having a first region and a second region adjacent to each other, wherein the sacrificial layer pattern is located in the second region, and has an upper sharp corner profile formed on a side adjacent to the first region;

forming a transparent conductive thin-film in the first and second regions of the substrate with the sacrificial layer pattern formed thereon, wherein a thickness ratio of the transparent conductive thin-film to the sacrificial layer pattern is less than or equal to 1:1.5, and the transparent conductive thin-film is disconnected at the upper sharp corner profile of the sacrificial layer pattern, such that at least a part of a side surface of the sacrificial layer pattern facing the first region is exposed; and removing the sacrificial layer pattern so as to reserve the transparent conductive thin-film in the first region as the transparent conductive electrode.

(2) The method according to (1), wherein the sacrificial layer pattern is formed to have a cross section of inverted trapezoid shape.

(3) The method according to (1) or (2), wherein the thickness ratio of the transparent conductive thin-film to the sacrificial layer pattern is between 1:1.5 and 1:3.

(4) The method according to any one of (1) to (3), wherein the removing the sacrificial layer pattern is performed by a wet etching process, and a wet etchant adopted in the wet etching process has an etching selection ratio of the transparent conductive thin-film to the sacrificial layer pattern which is smaller than or equal to 1:20.

(5) The method according to (4), wherein the wet etchant adopted in the wet etching process has an etching selection ratio of the transparent conductive thin-film to the sacrificial layer pattern which is between 1:20 and 1:200.

(6) The method according to any one of (1) to (5), wherein a material of the transparent conductive thin-film is ITO or IZO.

(7) The method according to any one of (1) to (6), wherein a material of the sacrificial layer pattern comprises a metal nitrogen oxide.

(8) The method according to (7), wherein the metal nitrogen oxide comprises zinc nitrogen oxide.

(9) The method according to any one of (2) to (8), wherein the wet etchant is a hydrochloric acid solution with a concentration of 0.1%-0.3% and a temperature of 20° C. 45° C.

(10) A fabrication method of an array substrate, comprising: forming a thin film transistor on a base substrate, and forming a pixel electrode electrically connected to a drain of the thin film transistor, wherein the pixel electrode is fabricated by the fabrication method according to any one of the (1) to (9).

(11) The method according to (10), wherein, in a case that the pixel electrode is formed after forming the thin film transistor, a process temperature for forming the sacrificial layer pattern during fabricating the pixel electrode is less than 200° C.

(12) A fabrication method of an array substrate, comprising: forming a thin film transistor on a base substrate, forming a pixel electrode electrically connected to a drain of the thin film transistor, and forming a common electrode, wherein the pixel electrode and the common electrode are both fabricated by the fabrication method according to any one of (1) to (9).

(13) The method according to (12), wherein, in a case that the pixel electrode and/or the common electrode are/is formed after forming the thin film transistor, a temperature for forming the sacrificial layer pattern during forming the pixel electrode and/or the common electrode is less than 200° C.

The present disclosure has been fully described both in general terms and specific implementation modes as described above, but some modifications or improvements based on the present disclosure is apparent to the skilled in the art. Therefore, the modifications or improvements made without departing from the spirit of the present disclosure are all within the scope of the present disclosure.

The present application claims priority of Chinese Patent Application No. 201410064958.7 filed on Feb. 25, 2014, the disclosure of which is incorporated herein by reference in its entirety as part of the present application.

What is claimed is:

1. A fabrication method of a transparent conductive electrode, comprising:
forming a sacrificial layer pattern on a substrate, the substrate having a first region and a second region adjacent to each other, wherein the sacrificial layer pattern is located directly above the second region, and has an upper sharp corner profile formed on a side of the sacrificial layer adjacent to the first region;
forming a transparent conductive thin-film directly above the first and second regions of the substrate and on the sacrificial layer pattern, wherein the transparent conductive thin-film is disconnected at the upper sharp corner profile of the sacrificial layer pattern, such that at least a part of a side surface of the sacrificial layer pattern facing the first region is exposed; and
removing the sacrificial layer pattern so as to reserve the transparent conductive thin-film directly above the first region as the transparent conductive electrode,
wherein, a material of the sacrificial layer pattern comprises a metal nitrogen oxide.

2. The method according to claim 1, wherein the sacrificial layer pattern is formed to have a cross section of inverted trapezoid shape.

3. The method according to claim 1, wherein a thickness ratio of the transparent conductive thin-film to the sacrificial layer pattern is between 1:1.5 and 1:3.

4. The method according to claim 1, wherein the removing the sacrificial layer pattern is performed by a wet etching process, and a wet etchant adopted in the wet etching process has an etching selection ratio of the transparent conductive thin-film to the sacrificial layer pattern which is smaller than or equal to 1:20.

5. The method according to claim 4, wherein the wet etchant adopted in the wet etching process has an etching selection ratio of the transparent conductive thin-film to the sacrificial layer pattern which is between 1:20 and 1:200.

6. The method according to claim 1, wherein a material of the transparent conductive thin-film is ITO or IZO.

7. The method according to claim 1, wherein the metal nitrogen oxide comprises zinc nitrogen oxide.

8. The method according to claim 2, wherein the removing the sacrificial layer pattern is performed by a wet etching process, and a wet etchant adopted in the wet etching process has an etching selection ratio of the transparent conductive thin-film to the sacrificial layer pattern which is smaller than or equal to 1:20.

9. A fabrication method of an array substrate, comprising: forming a thin film transistor on a base substrate, and forming a pixel electrode electrically connected to a drain of the thin film transistor, wherein the pixel electrode is fabricated by the fabrication method of the transparent conductive electrode according to claim 1.

10. The method according to claim 9, wherein, the pixel electrode is formed after forming the thin film transistor, a process temperature for forming the sacrificial layer pattern during fabricating the pixel electrode is less than 200° C.

11. A fabrication method of an array substrate, comprising: forming a thin film transistor on a base substrate, forming a pixel electrode electrically connected to a drain of the thin film transistor, and forming a common electrode, wherein the pixel electrode and the common electrode are both fabricated by the fabrication method of the transparent conductive electrode according to claim 1.

12. The method according to claim 11,
wherein, the pixel electrode and/or the common electrode are/is formed after forming the thin film transistor, a temperature for forming the sacrificial layer pattern during forming the pixel electrode and/or the common electrode is less than 200° C.

13. The method according to claim 2, wherein a thickness ratio of the transparent conductive thin-film to the sacrificial layer pattern is between 1:1.5 and 1:3.

14. The method according to claim 8, wherein the wet etchant is a hydrochloric acid solution with a concentration of hydrochloric acid of 0.1%-0.3% and a temperature of 20° C.-45° C.

15. The method according to claim 3, wherein the removing the sacrificial layer pattern is performed by a wet etching process, and a wet etchant adopted in the wet etching process has an etching selection ratio of the transparent conductive thin-film to the sacrificial layer pattern which is smaller than or equal to 1:20.

16. The method according to claim 2, wherein a material of the transparent conductive thin-film is ITO or IZO.

17. The method according to claim 3, wherein a material of the transparent conductive thin-film is ITO or IZO.

18. The method according to claim 4, wherein a material of the transparent conductive thin-film is ITO or IZO.

19. The method according to claim 5, wherein a material of the transparent conductive thin-film is ITO or IZO.

20. The method according to claim 1, wherein a thickness ratio of the transparent conductive thin-film to the sacrificial layer pattern is less than or equal to 1:1.5.

* * * * *